United States Patent
Lee et al.

(10) Patent No.: US 7,946,283 B2
(45) Date of Patent: May 24, 2011

(54) TOY GUN MECHANISM WITH A SLIDING BOLT ASSEMBLY

(76) Inventors: Yi-Jung Lee, Sijhih (TW); Li-Te Cheng, Taipei (TW)

( * ) Notice: Subject to any disclaimer, the term of this patent is extended or adjusted under 35 U.S.C. 154(b) by 299 days.

(21) Appl. No.: 12/179,331

(22) Filed: Jul. 24, 2008

(65) Prior Publication Data

US 2010/0022160 A1  Jan. 28, 2010

(30) Foreign Application Priority Data

Jan. 29, 2008 (TW) ............................. 97103258 A (51) Int. Cl.
*F41B 11/14* (2006.01)

(52) U.S. Cl. ..................... 124/67; 446/473; 42/69.02

(58) Field of Classification Search .............. 42/69.02; 446/401, 400, 473; 124/60, 63, 65, 66, 67
See application file for complete search history.

(56) References Cited

U.S. PATENT DOCUMENTS

| | | | | |
|---|---|---|---|---|
| 2,548,984 A * | 4/1951 | Lennberg, Jr. | ................. | 124/66 |
| 2,580,356 A * | 12/1951 | Gayle | ............................. | 124/66 |
| 2,604,088 A * | 7/1952 | Wells | ............................. | 124/67 |
| 2,710,607 A * | 6/1955 | Heilman | ........................ | 124/66 |
| 5,261,384 A * | 11/1993 | Hu | ................................. | 124/66 |
| 5,531,210 A * | 7/1996 | Meiser et al. | .................. | 124/66 |
| 6,250,294 B1 * | 6/2001 | Lim | ............................... | 124/66 |
| 6,564,788 B1 * | 5/2003 | Hu | ................................. | 124/66 |
| 6,564,789 B1 * | 5/2003 | Hu | ................................. | 124/66 |
| 7,077,117 B1 * | 7/2006 | Chu | ............................... | 124/32 |
| 7,100,592 B1 * | 9/2006 | Yang | .............................. | 124/67 |
| 7,712,462 B2 * | 5/2010 | Pedicini et al. | ................. | 124/65 |
| 7,730,881 B1 * | 6/2010 | Pedicini et al. | ................. | 124/65 |
| 2003/0098019 A1 * | 5/2003 | Hu | ................................. | 124/66 |
| 2003/0098020 A1 * | 5/2003 | Hu | ................................. | 124/66 |
| 2005/0235975 A1 * | 10/2005 | Pedicini et al. | ................. | 124/67 |
| 2006/0191523 A1 * | 8/2006 | Paletz et al. | ..................... | 124/67 |
| 2006/0231083 A1 * | 10/2006 | Tsurumoto | ..................... | 124/66 |
| 2006/0243263 A1 * | 11/2006 | Tsurumoto | ..................... | 124/66 |
| 2007/0261689 A1 * | 11/2007 | Tai et al. | ......................... | 124/67 |
| 2007/0283941 A1 * | 12/2007 | Tai et al. | ......................... | 124/67 |
| 2007/0283942 A1 * | 12/2007 | Tai et al. | ......................... | 124/67 |
| 2009/0235911 A1 * | 9/2009 | Klarborg | ......................... | 124/66 |
| 2010/0065033 A1 * | 3/2010 | Yang | .............................. | 124/66 |

FOREIGN PATENT DOCUMENTS

GB      2110348 A  *  6/1983
WO  WO 2007122719 A1  *  11/2007

OTHER PUBLICATIONS

"Arms Magazine," vol. 12, pp. 33, Dec. 1, 2007.

* cited by examiner

*Primary Examiner* — Benjamin P Lee
(74) *Attorney, Agent, or Firm* — Hamre, Schumann, Mueller & Larson, P.C.

(57) ABSTRACT

The present invention relates to a toy gun mechanism with a sliding bolt assembly that closely resembles a real gun when the toy gun is fired and comprises a housing, a motor, a gear assembly, a bolt assembly, a trigger assembly and a latch. The gear assembly is mounted in the housing and is connected to and driven by the motor. The bolt assembly is mounted slidably in the housing and is selectively moved to a cocked position by the gear assembly. The trigger assembly releases the bolt assembly and drives air from the bolt assembly as the bolt assembly moves forward.

1 Claim, 8 Drawing Sheets

TOY GUN MECHANISM WITH A SLIDING BOLT ASSEMBLY

FIELD OF THE INVENTION

The present invention relates to toy gun mechanism and more particularly, to a toy gun with a sliding bolt assembly that moves back and forth when the toy gun is fired to imitate a real gun.

BACKGROUND OF THE INVENTION

In many countries, ownership of guns is controlled and regulated by government laws. Under strict gun control, private citizens can only own toy guns.

Most toy guns currently available that shoot toy bullets use either compressed gas cylinders or powerful springs to shoot the toy bullets.

Such a toy gun is shown in Arms Magazine, Vol. 12, pp. 33, 2007, and uses a powerful spring to shoot bullets. The toy gun comprises a motor, a housing, a gear assembly and a piston assembly.

The gear assembly is mounted in the housing and is connected to and rotated by the motor.

The piston assembly is mounted in the housing, is connected to the gear assembly and comprises a piston sleeve, a piston rod and a powerful spring.

The piston sleeve is hollow, has an inner chamber and is mounted securely in the housing. The inner chamber is filled with air.

The piston rod is mounted slidably in the piston sleeve, is connected to and driven by the gear assembly, compresses air in the piston sleeve and has two ends and grooves. The air compressed in piston sleeve propels toy bullets from the housing. The grooves connect to and drive the gear assembly.

The powerful spring is mounted at one end of the piston rod.

However, a real gun has a bolt moving back and forth when the gun is fired. Furthermore, motion associated with the bolt is clearly visible. This does not happen in toy guns because the piston rod of the toy gun slides inside the piston sleeve and is hidden from view. Accordingly, toy guns are not realistic enough to satisfy serious collectors.

SUMMARY OF THE INVENTION

The objective of the present invention is to make a toy gun's appearance more realistic when fired.

The present invention relates to a toy gun mechanism with a sliding bolt assembly that closely resembles a real gun when the toy gun is fired and comprises a housing, a motor, a gear assembly, a bolt assembly, a trigger assembly and a latch. The gear assembly is mounted in the housing and is connected to and driven by the motor. The bolt assembly is mounted slidably in the housing and is selectively moved to a cocked position by the gear assembly. The trigger assembly releases the bolt assembly and drives air from the bolt assembly as the bolt assembly moves forward.

BRIEF DESCRIPTIONS OF THE DRAWINGS

The foregoing aspects, as well as many of the attendant advantages and features of this invention will become more apparent by reference to the following detailed description, when taken in conjunction with the accompanying drawings, wherein.

DETAILED DESCRIPTIONS OF THE PREFERRED EMBODIMENT

With reference to FIGS. 1, 2, 3 and 8, a toy gun mechanism in accordance with the present invention comprises a housing (10), a motor (60), a gear assembly (20), a bolt assembly (30), a trigger assembly (40) and a latch (50).

The housing (10) has a top, a bottom, a front end and an opening and comprises two shells (10A, 10B), a gear chamber (11) and a bolt chamber (12). The opening is formed longitudinally through the front end near the top of the housing (10).

The shells (10A, 10B) connect to each other to form the housing (10).

The gear chamber (11) is formed inside the housing (10) along the bottom.

The bolt chamber (12) is formed longitudinally inside the housing (10) between the shells (10A, 10B) and communicates with the gear chamber (11) and the opening in the front end of the housing (10).

The motor (60) has a drive shaft. The drive shaft protrudes into the gear chamber (11).

The gear assembly (20) is mounted in the gear chamber (11), is driven by the drive shaft of the motor (60) and comprises multiple transmission gears and a drive gear (21). The drive gear (21) has multiple teeth (22). The teeth (22) are formed part way around the drive gear (21) and have a gap.

The bolt assembly (30) comprises a bolt sleeve (31), a piston rod (32), a main spring (33) and an auxiliary spring (34).

Figure 4:
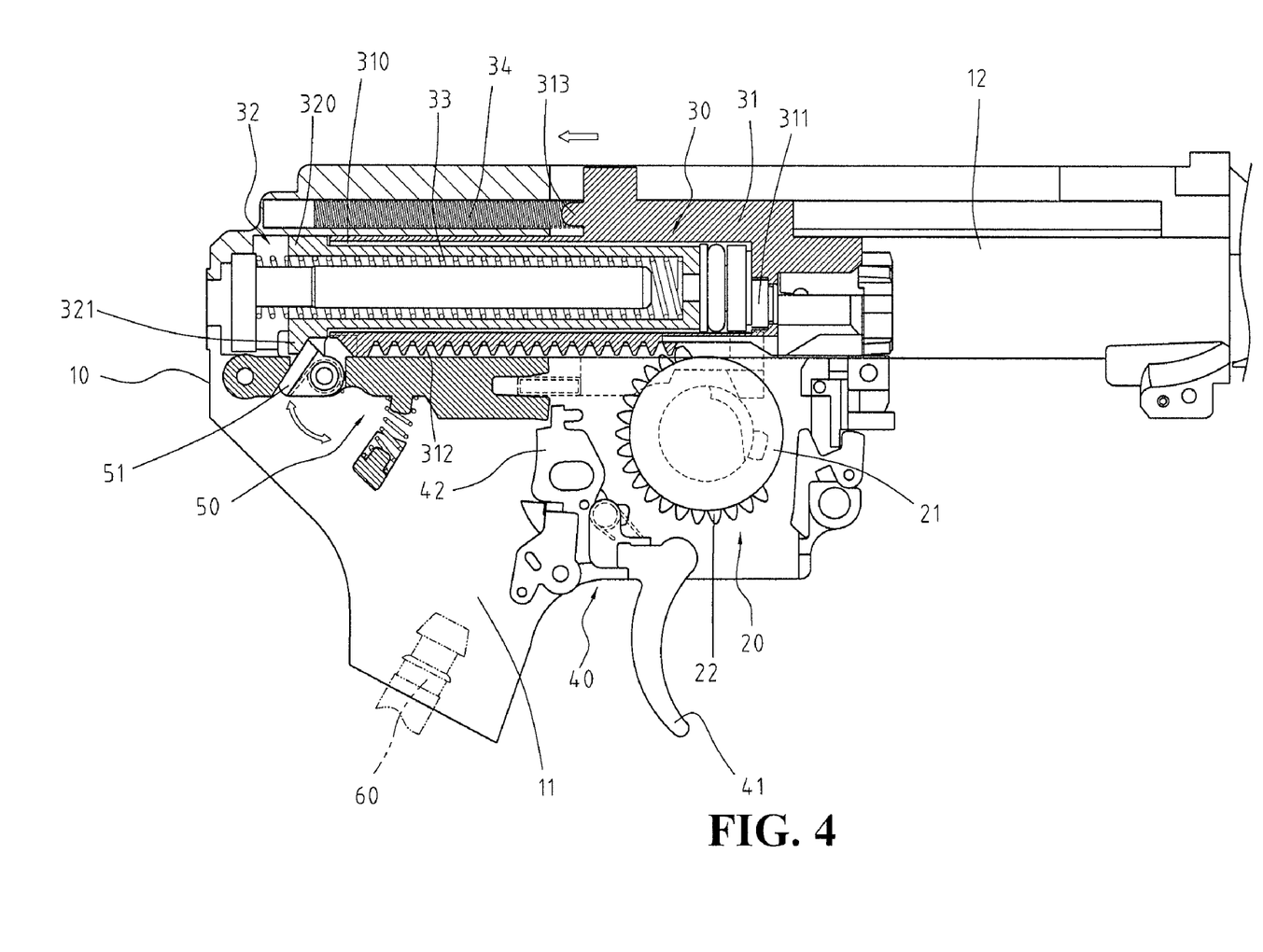
FIG. 4 is an operational side view in partial section of the toy gun mechanism in FIG. 2 with the sliding bolt retracted.
Figure 5:
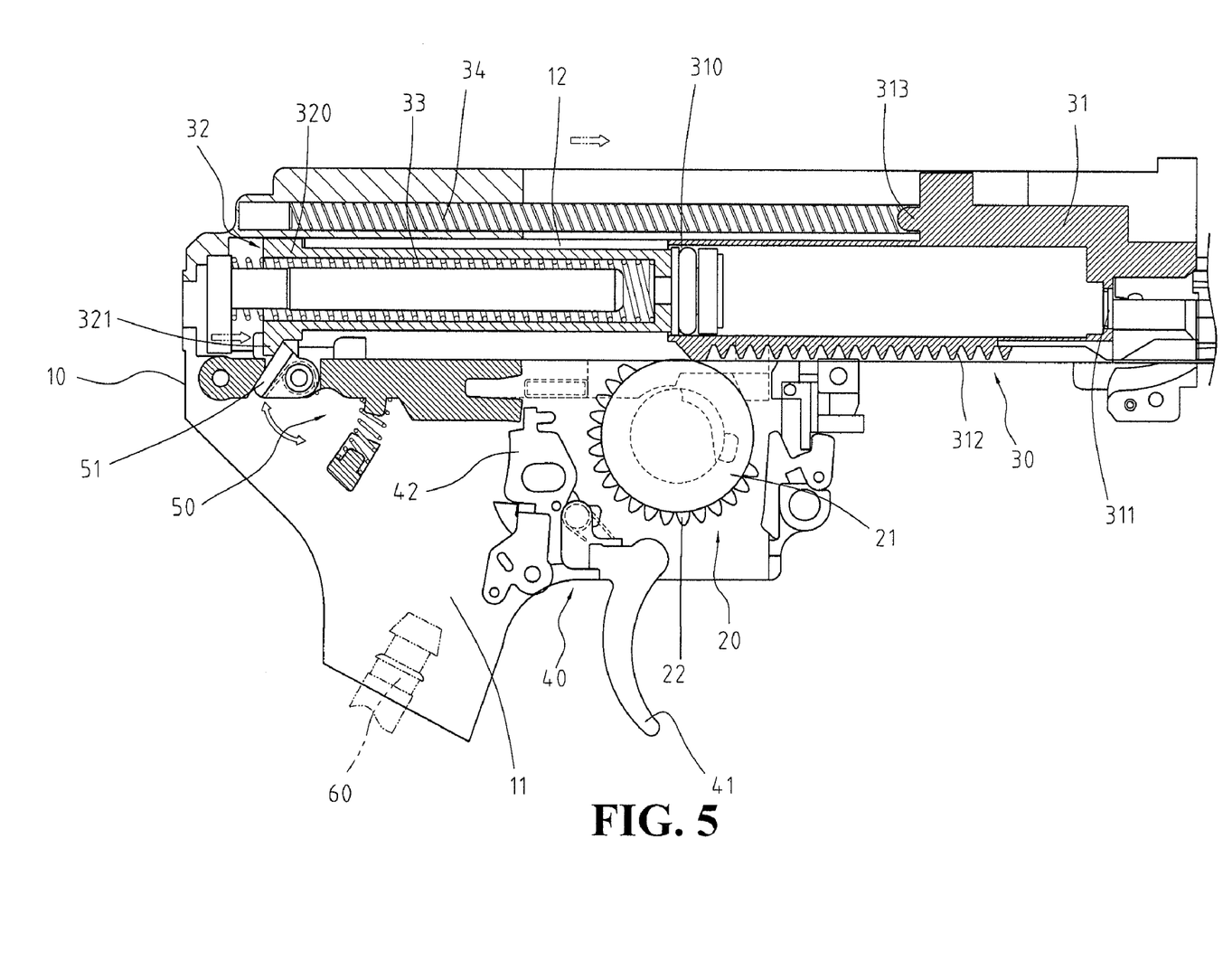
FIG. 5 is an operational side view in partial section of the toy gun mechanism in FIG. 2 with the sliding bolt in a cocked and chambered position.
Figure 6:
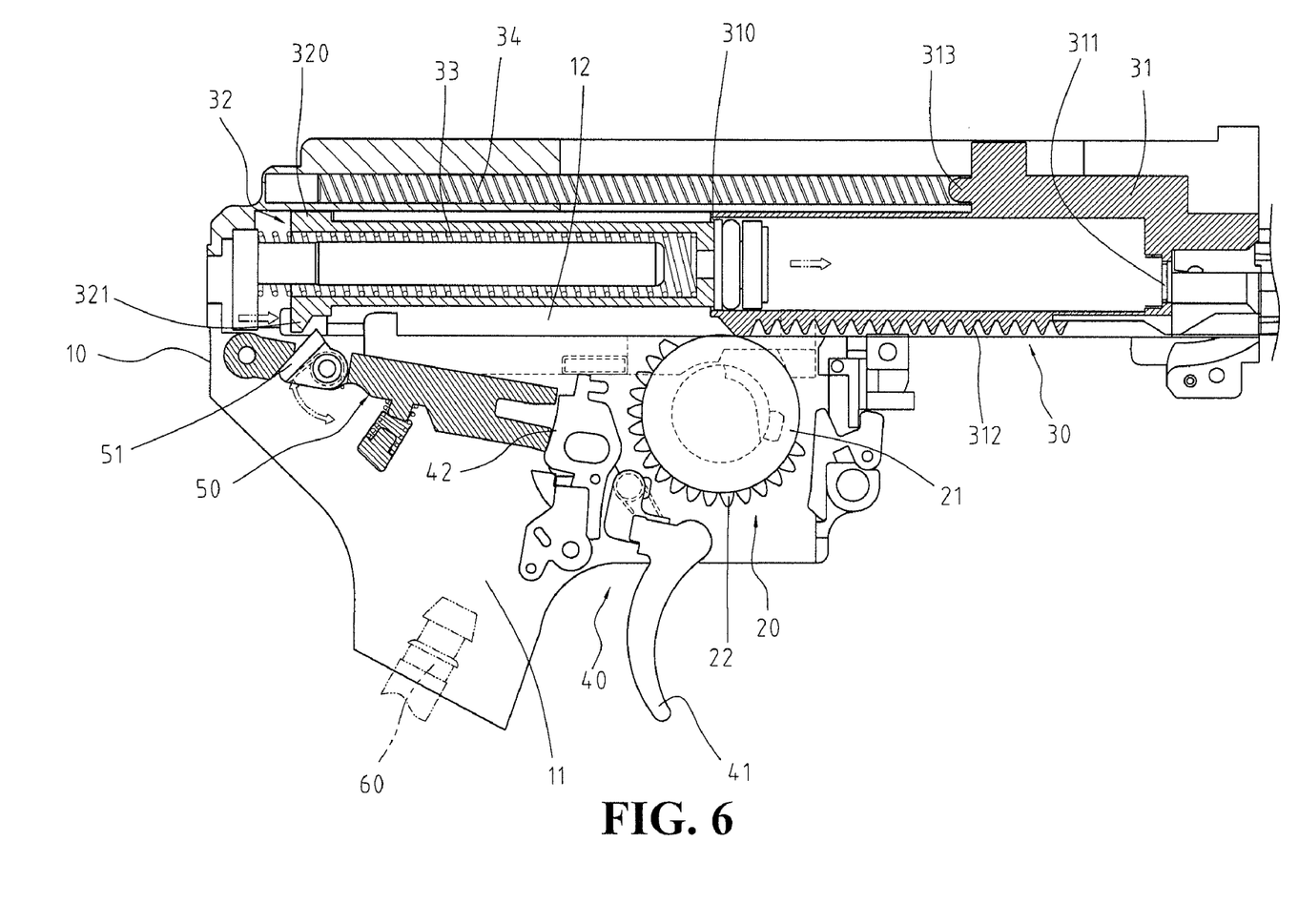
FIG. 6 is an operational side view in partial section of the toy gun mechanism in FIG. 2 immediately after pulling the trigger.
Figure 7:
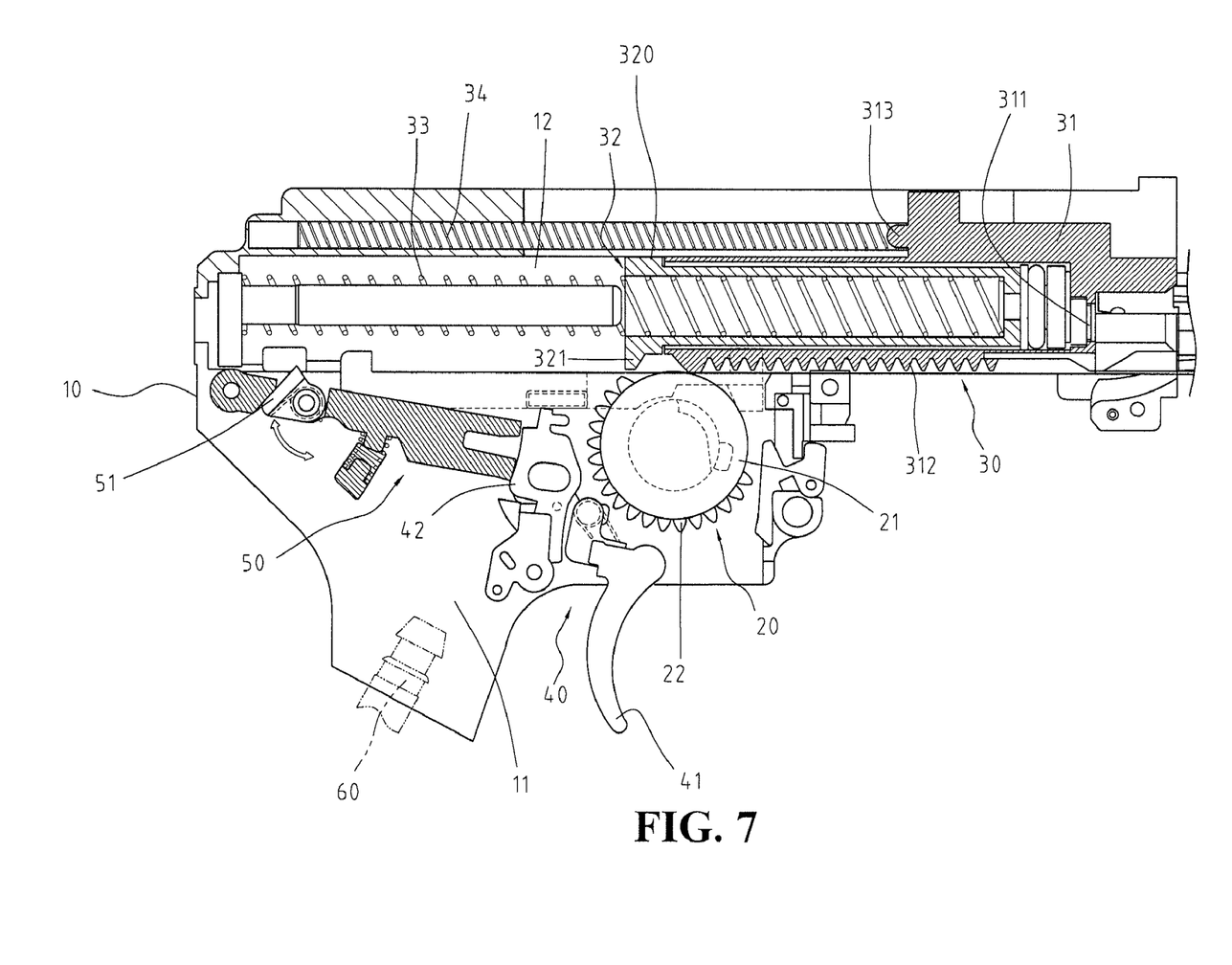
FIG. 7 is an operational side view in partial section of the toy gun mechanism in FIG. 2 after air in the toy gun mechanism has been compressed and propelled from the toy gun mechanism.
Figure 8:
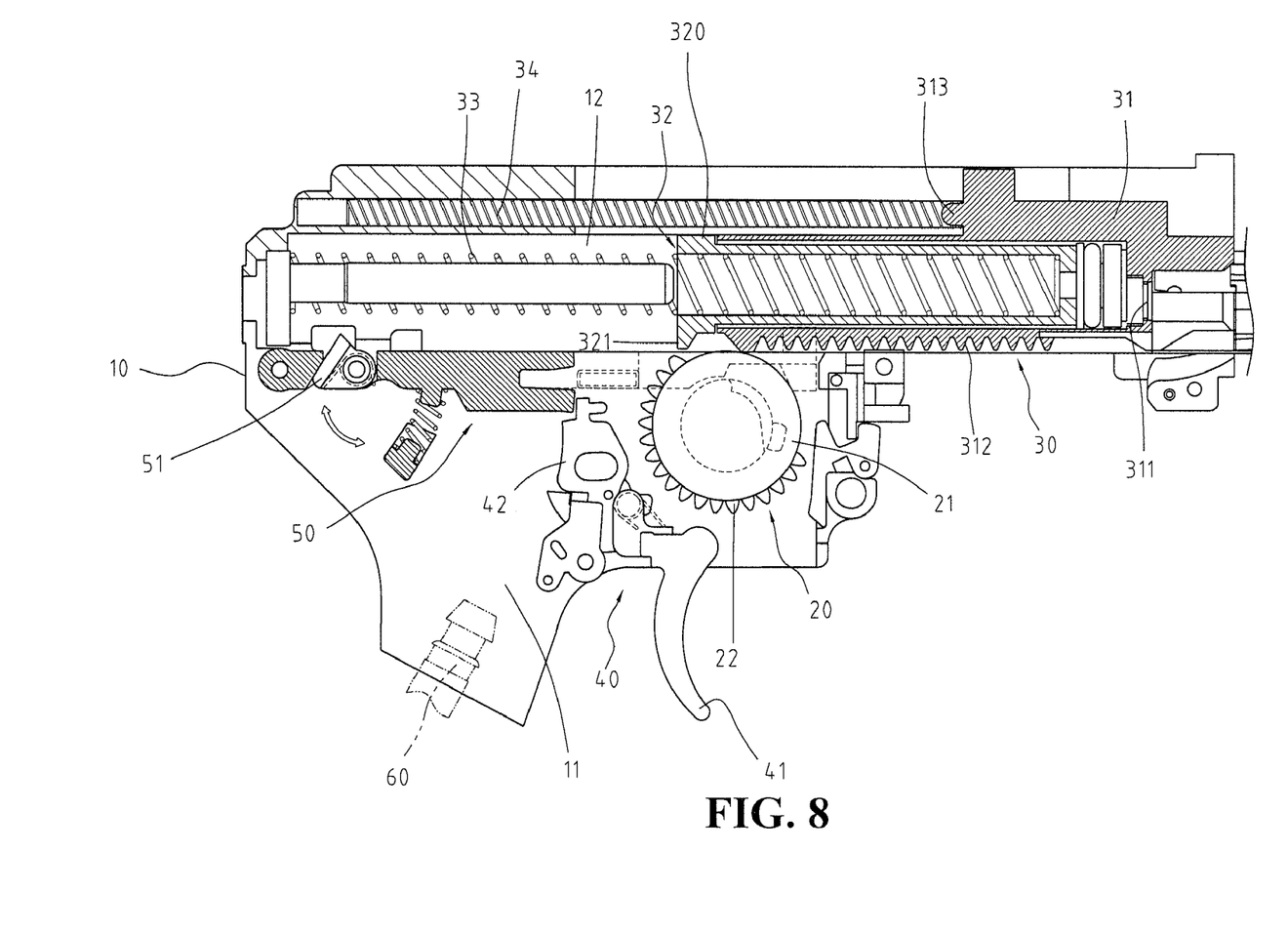
FIG. 8 is an operational side view in partial section of the toy gun mechanism in FIG. 2 before the gear mechanism recycles to cock the toy gun mechanism.

The bolt sleeve (31) is hollow and has two ends, a top surface, a bottom surface, multiple drive teeth (312), a mounting projection and a boss (313). One end has an opening (310). The other end has an air ejection port (311). With further reference to FIGS. 4, 5 and 6, the drive teeth (312) are formed transversely along the bottom surface and are selectively engaged by the teeth (22) on the drive gear (21) to retract the bolt sleeve (31) and cock the bolt assembly (30). The mounting projection is formed on and protrudes from the top surface and has a rear surface. The boss (313) is formed on the rear surface of the mounting projection.

The piston rod (32) is mounted slidably in the bolt sleeve (31) through the opening (310) and has a front end, a rear end and a protruding rim (320). The protruding rim (320) is formed at and protrudes out from the rear end of the piston rod (32), abuts the end of the bolt sleeve (31) with the opening (310) when the piston rod (32) is inserted completely into the bolt sleeve (31) and has a lower edge and a protruding tab (321).

The main spring (33) is mounted coaxially against the rear end of the piston rod (32).

The auxiliary spring (34) is mounted longitudinally above the bolt sleeve (31) on the boss (313).

The trigger assembly (40) comprises a trigger (41) and a lever (42). The lever (42) is pivotally mounted in the housing (10), is selectively pivoted by the trigger (41) and has an upper end and a lower end.

With further reference to FIGS. 4, 5, 6 and 7, the latch (50) is mounted pivotally in the housing (10) between the bolt chamber (12) and the gear chamber (11), extends into the gear chamber (11), selectively abuts and limits the upper end of the lever (42) and has a catch (51). The catch (51) engages and holds the protruding tab (321) when the bolt sleeve (31) retracts the piston rod (32) so the piston rod (32) is held in a cocked position until the trigger (41) is pulled. The catch (51) is pushed to move downward with the latch (50) by the protruding tab (321) when the trigger (41) is pulled and makes the upper end of the lever (42) leave the latch (50).

Figure 1:
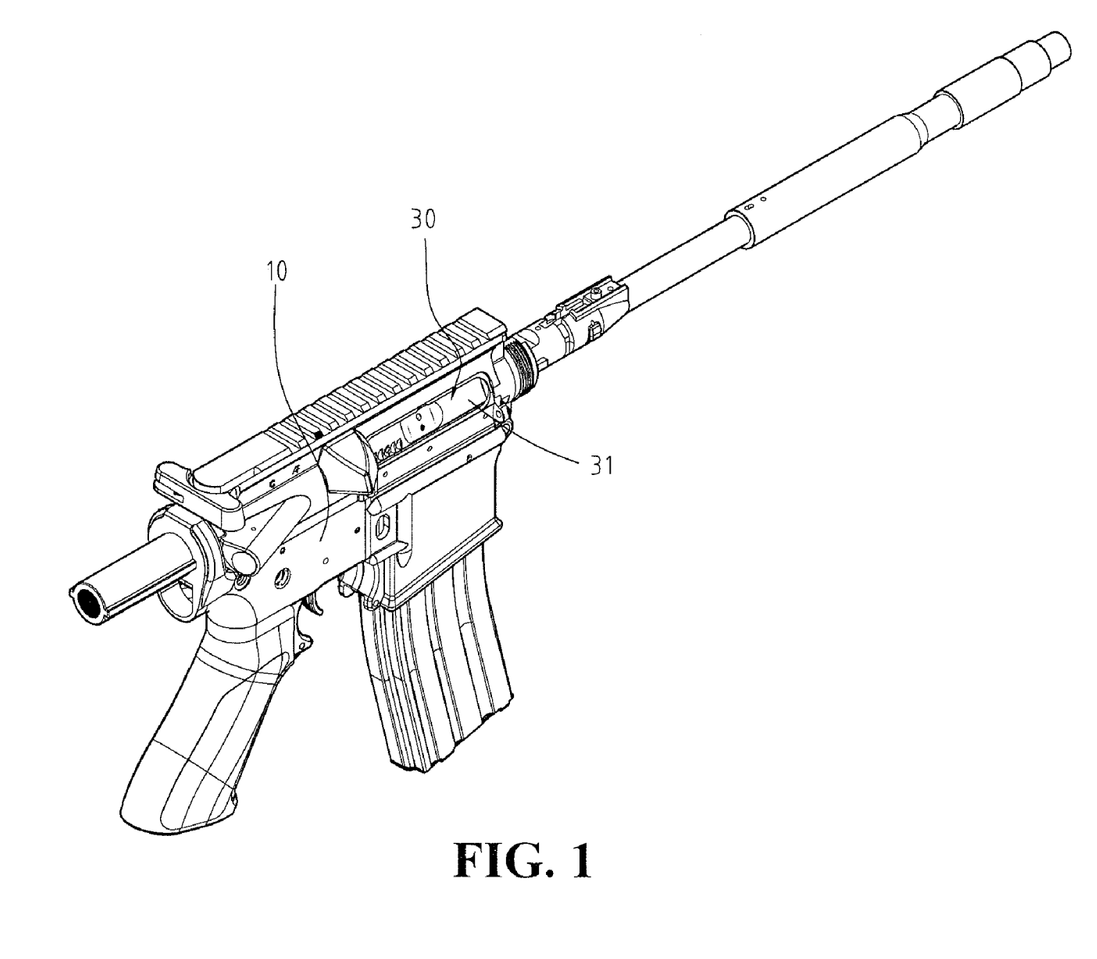
FIG. 1 is a perspective view of a toy gun with a sliding bolt assembly in accordance with the present invention.
Figure 2:
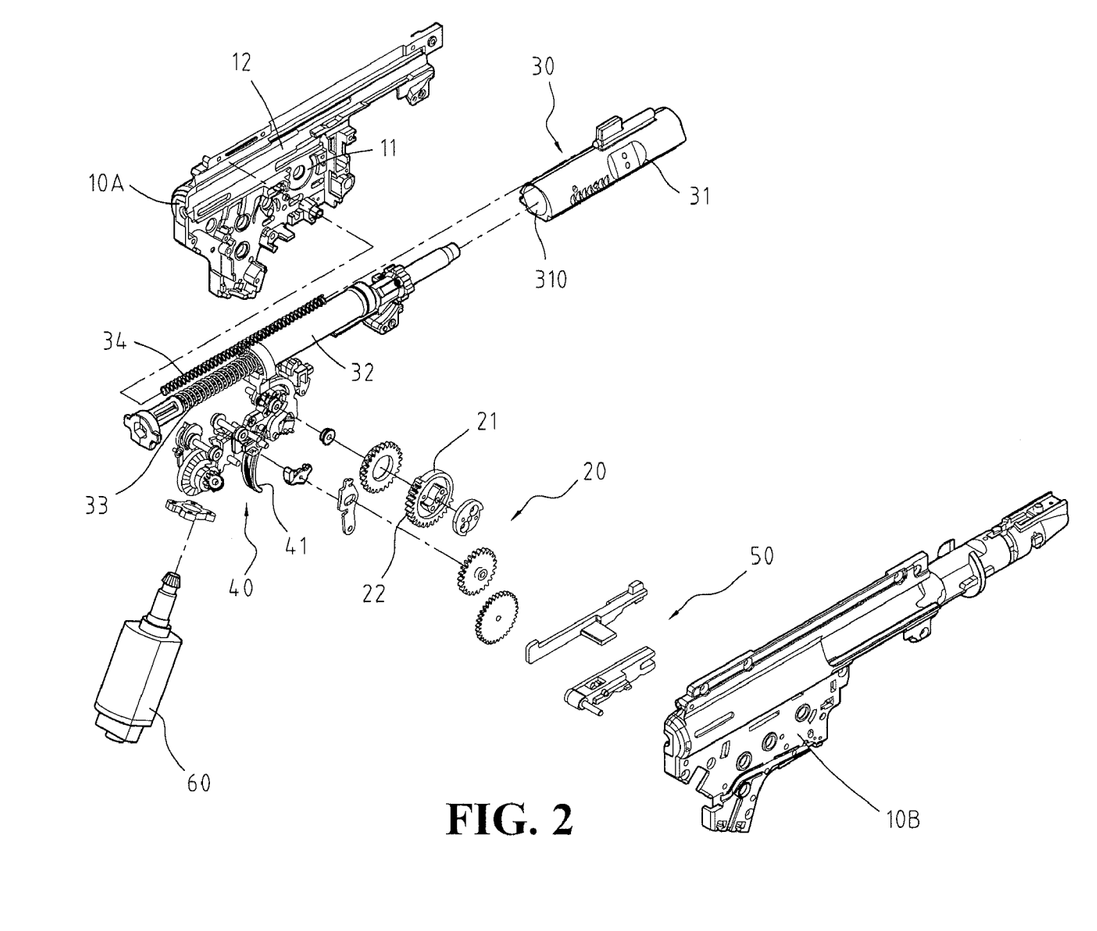
FIG. 2 is an exploded perspective view of a toy gun mechanism with a sliding bolt FIG. 1.
Figure 3:
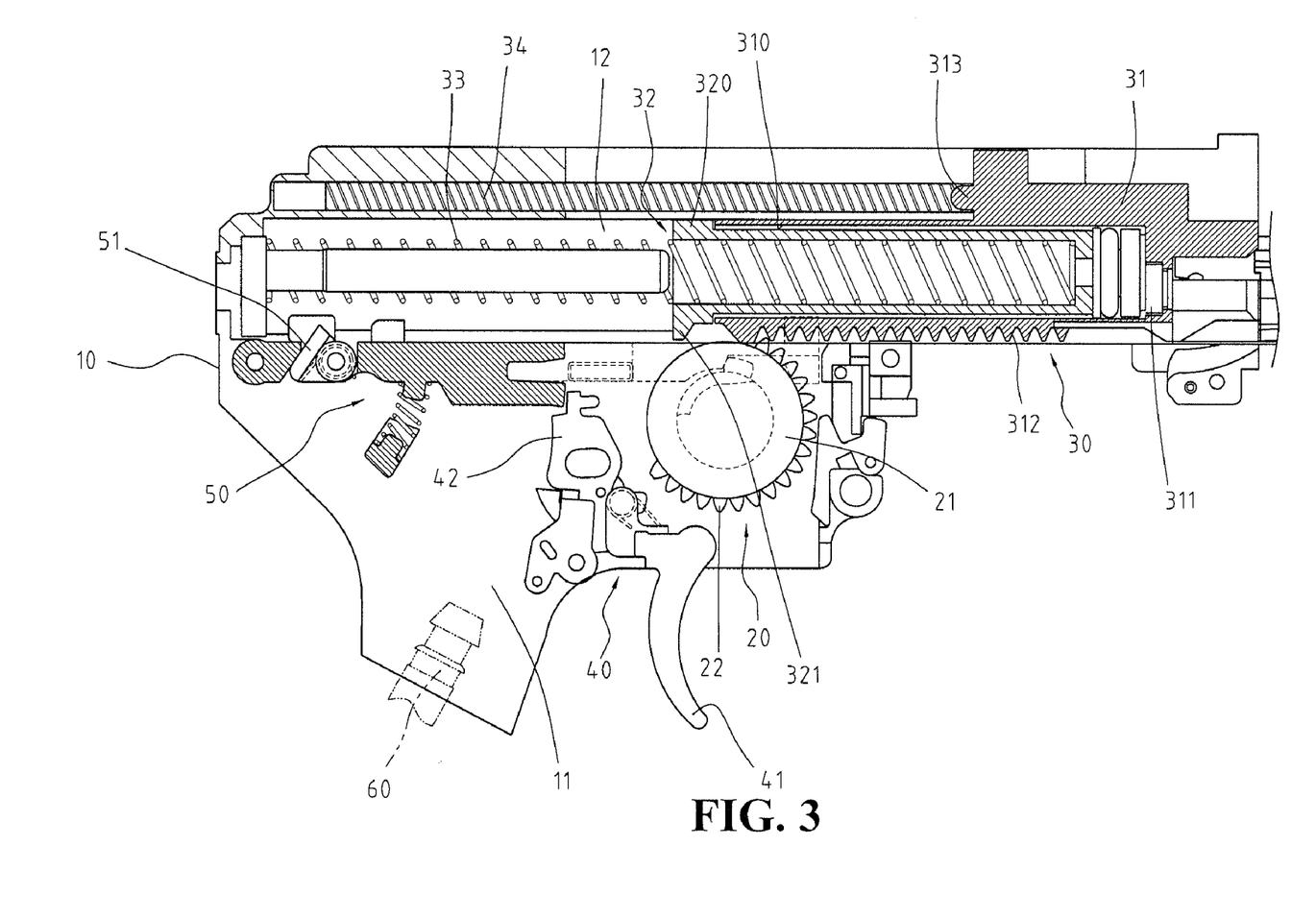
FIG. 3 is a side view in partial section of the toy gun mechanism in FIG. 2.

FIGS. 3-5 illustrate how the bolt sleeve (31) works. FIG. 3 illustrates that the piston rod (32) completely inserts into the bolt sleeve (31) due to the restoring force of the main spring (33); FIG. 4 illustrates that the bolt sleeve (31) is driven by the drive gear (21) so as to retract in the bolt chamber (12) and the bolt sleeve (31) also drives the piston rod (32) to retract until the piston rod (32) is cocked by the catch (51); FIG. 5 illustrates that the auxiliary spring (34) biases the bolt sleeve (31) to move forward while the multiple drive teeth (312) disengage from the teeth (22) on the drive gear (21) and the piston rod (32) remains cocked by the catch (51). Accordingly, the bolt sleeve (31) can move back and forth so as to imitate the bolt motion of a real gun when the gun is fired.

People skilled in the art will understand that various changes, modifications, and alterations in form and details may be made without departing from the spirit and scope of the invention.

What is claimed is:
1. A toy gun mechanism with a sliding bolt assembly comprising:
    a housing having
        a top;
        a bottom;
        a front end; and
        an opening being formed longitudinally through the front end near the top of the housing; and
    comprising
        two shells being connected to each other to form the housing;
        a gear chambers being formed inside the housing along the bottom; and
        a bolt chamber being formed longitudinally inside the housing between the shells and communicating with gear chamber and the opening in the front of the housing;
    a motor having a drive shaft protruding into the gear chamber;
    a gear assembly being mounted in the gear chamber, being driven by the drive shaft of the motor and comprising multiple transmission gears; and
    a drive gear having multiple teeth being formed part way around the drive gear and having a gap;
    a bolt assembly comprising
        a bolt sleeve being hollow and mounted slidably in the bolt chamber and having two ends;
        one end having an opening; and
        the other end having an air ejection port;
        a top surface;
        a bottom surface;
            multiple drive teeth being formed transversely along the bottom surface and being selectively engaged by the teeth on the drive gear thereby the drive gear can drive the bolt sleeve to retract in the bolt chamber;
            a mounting projection being formed on and protruding from the top surface and having a rear surface; and
            a boss being formed on the rear surface of the mounting projection;
        a piston rod being mounted slidably in the bolt sleeve through the opening and having a front end;
        a rear end; and
        a protruding rim being formed at and protruding out from the rear end of the piston rod, selectively abutting the end of the bolt sleeve with the opening thereby the bolt sleeve forces the piston rod to retract while the bolt sleeve retracts in the bolt chamber and has
            a lower edge; and
            a protruding tab;
    a main spring being mounted coaxially against the rear end of the piston rod; and
        an auxiliary spring being mounted longitudinally above the bolt sleeve on the boss so as to bias the bolt sleeve to move forward while the multiple drive teeth of the bolt sleeve selectively disengage from the teeth on the drive gear;
    a trigger assembly comprising
        a trigger; and
        a lever; being pivotally mounted in the housing, being selectively pivoted by the trigger and having
            an upper end; and
            a lower end; and
        a latch being mounted pivotally in the housing between the bolt chamber and the gear chamber, extending into the gear chamber, selectively abutting and limiting the upper end of the lever and having a catch engaging and holding the protruding tab, whereby when the gun is fired, the bolt sleeve moves back and forth by the drive gear and the auxiliary spring thereby imitates a bolt motion of a real gun.

* * * * *